United States Patent
Leong et al.

(10) Patent No.: US 12,081,207 B2
(45) Date of Patent: Sep. 3, 2024

(54) PASSIVE DISCHARGE CIRCUIT FOR BIDIRECTIONAL SEMICONDUCTOR SWITCHES

(71) Applicant: Infineon Technologies Austria AG, Villach (AT)

(72) Inventors: Kennith Kin Leong, Villach (AT); Gerhard Maderbacher, Gleisdorf (AT); Herwig Wappis, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 18/099,639

(22) Filed: Jan. 20, 2023

(65) Prior Publication Data

US 2024/0250681 A1    Jul. 25, 2024

(51) Int. Cl.
*H03K 17/56*    (2006.01)

(52) U.S. Cl.
CPC .................... *H03K 17/56* (2013.01)

(58) Field of Classification Search
CPC ............ H01L 29/423; H01L 29/7787; H01L 29/42316; H01L 29/1066; H01L 27/085; H01L 29/7831; H01L 29/41766; H01L 29/2003; H01L 21/8252; H02M 3/33584; H02M 1/0058; H03K 17/687; G05F 3/205
USPC ........................................................ 327/427
See application file for complete search history.

(56) References Cited

U.S. PATENT DOCUMENTS

| | | | |
|---|---|---|---|
| 7,595,680 | B2 | 9/2009 | Morita et al. |
| 7,852,137 | B2 | 12/2010 | Machida et al. |
| 7,868,353 | B2 | 1/2011 | Machida et al. |
| 7,875,907 | B2 | 1/2011 | Honea et al. |
| 8,344,424 | B2 | 1/2013 | Suh et al. |
| 8,604,512 | B2 | 12/2013 | Morita |
| 9,443,845 | B1 | 9/2016 | Stafanov et al. |

(Continued)

FOREIGN PATENT DOCUMENTS

| | | |
|---|---|---|
| EP | 3249815 A1 | 11/2017 |
| WO | 2017159559 A1 | 9/2017 |
| WO | 2023278194 A1 | 1/2023 |

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, 1218-1226.
Chowdhury, Dilder, "GaN FETs: Why cascode?", Sep. 30, 2020, pp. 1-6.

(Continued)

*Primary Examiner* — Quan Tra
(74) *Attorney, Agent, or Firm* — Murphy, Bilak & Homiller, PLLC (57) ABSTRACT

A semiconductor device includes: a semiconductor body having an active region and a substrate region beneath the active region; a bidirectional switch having first and second gate structures configured to control a conductive state of a channel in the active region, and first and second input-output terminals electrically connected to the channel; and a passive discharge circuit in parallel with the bidirectional switch and configured to utilize a fraction of a voltage across the first and second input-output terminals to switch on a transistor device that electrically connects the substrate region to the input-output terminal at the lower potential during an off-state of the bidirectional switch and during ZVS (zero-voltage switching) transition periods.

19 Claims, 8 Drawing Sheets

(56) References Cited

U.S. PATENT DOCUMENTS

| | | |
|---|---|---|
| 10,224,924 B1 | 3/2019 | Leong |
| 10,784,853 B2 | 9/2020 | Leong |
| 2006/0145744 A1 | 7/2006 | Diorio et al. |
| 2009/0206363 A1 | 8/2009 | Machida et al. |
| 2012/0217542 A1 | 8/2012 | Morita |
| 2014/0203289 A1 | 7/2014 | Liu et al. |
| 2014/0264431 A1 | 9/2014 | Lal |
| 2014/0374766 A1 | 12/2014 | Bahl et al. |
| 2015/0180469 A1 | 6/2015 | Kim |
| 2016/0079233 A1 | 3/2016 | Deboy et al. |
| 2016/0247799 A1* | 8/2016 | Stafanov ............. H01L 29/7813 |
| 2017/0103978 A1 | 4/2017 | Prechtl et al. |
| 2017/0357283 A1 | 12/2017 | Adachi |
| 2019/0006499 A1 | 1/2019 | Kinoshita et al. |
| 2019/0326280 A1* | 10/2019 | Imam ................ H01L 29/42316 |
| 2022/0262960 A1 | 8/2022 | Schiele et al. |
| 2022/0385196 A1* | 12/2022 | Kanomata ........... H01L 29/7787 |
| 2022/0416784 A1* | 12/2022 | Harrison ............ H03K 17/6871 |

OTHER PUBLICATIONS

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, 1868-1878.

Huber, Jonas Emanuel, "Automatic Reverse Blocking Bidirectional Switch", U.S. Appl. No. 17/542,660, filed Dec. 6, 2021.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers For Electric Vehicle Battery Charging Systems", IEEE, 2013, 623-629.

* cited by examiner

PASSIVE DISCHARGE CIRCUIT FOR BIDIRECTIONAL SEMICONDUCTOR SWITCHES

BACKGROUND

Two separate gates with a common drain in a monolithic device is a popular configuration for realizing a bidirectional switch. The monolithic device is typically implemented in a common substrate, where each of the two switches has its own gate driver. The common drain configuration has a source at either end of the monolithic device, meaning that a source connection to the substrate is not an option for the bidirectional switch. If the substrate is kept floating and one of the two sources is biased at a high voltage, that source in conjunction with the adjacent gate acts as an extended drain and thus follows the high potential. The substrate must be kept as close to ground potential during on-state as possible for stable bidirectional device operation. Conventionally, two back-to-back diodes are integrated with their anodes connected to the substrate and each cathode connected to either end of the sources. However, such a back-to-back diode implementation does not hold the substrate voltage to the desired voltage (close to 0V) during the on-state of the bidirectional switch and thus degrades device performance. Instead, the substrate experiences a large negative potential because negative charge stored in the substrate during the off-state of the bidirectional switch is confined to the substrate which is in the middle point of the back-to-back diode. This confinement is induced by either diode in the back-to-back diodes initially forward-biased during the off-state of the bidirectional switch but changed to the blocking mode when the bidirectional device switches from the off-state to the on-state Hence, there is a need for a more effective monolithic solution for providing a discharge path for the substrate during the off-to-on switching of a bidirectional switch.

SUMMARY

According to an embodiment of a semiconductor device, the semiconductor device comprises: a semiconductor body comprising an active region and a substrate region beneath the active region; a bidirectional switch comprising first and second gate structures configured to control a conductive state of a channel in the active region, and first and second input-output terminals electrically connected to the channel; a first passive cascode circuit configured to block a voltage between the first input-output terminal and the substrate region and activate a discharge path between the substrate region and the second input-output terminal, when the bidirectional switch is in an off-state and the first input-output terminal is at a higher potential than the second input-output terminal; and a second passive cascode circuit configured to block a voltage between the second input-output terminal and the substrate region and activate a discharge path between the substrate region and the first input-output terminal, when the bidirectional switch is in the off-state and the second input-output terminal is at a higher potential than the first input-output terminal.

According to another embodiment of a semiconductor device, the semiconductor device comprises: a semiconductor body comprising an active region and a substrate region beneath the active region; a bidirectional switch comprising first and second gate structures configured to control a conductive state of a channel in the active region, and first and second input-output terminals electrically connected to the channel; and a passive discharge circuit in parallel with the bidirectional switch and configured to utilize a fraction of a voltage across the first and second input-output terminals to switch on a transistor device that electrically connects the substrate region to the input-output terminal at the lower potential during an off-state of the bidirectional switch and during ZVS (zero-voltage switching) transition periods.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 illustrates a ZVS (zero voltage switching) embodiment of the passive discharge circuit, where the middle part of FIG. 4 illustrates various voltage and current waveforms during ZVS turn on and ZVS turn off, the left-hand part of FIG. 4 illustrates the voltages and currents during ZVS turn off, and the right-hand part of FIG. 4 illustrates the voltages and currents during ZVS turn on.

FIG. 5 illustrates a hard switching embodiment of the passive discharge circuit, where the middle part of FIG. 5 illustrates various voltage and current waveforms during hard switching turn on and turn off, the left-hand part of FIG. 5 illustrates the voltages and currents during hard switching turn off, and the right-hand part of FIG. 5 illustrates the voltages and currents during three successive stages of hard switching turn on.

DETAILED DESCRIPTION

Embodiments described herein provide a passive discharge circuit for bidirectional semiconductor switches. The passive discharge circuit is monolithically integrated with the bidirectional switch and provides both a path for discharging the substrate voltage to a desired level (e.g., close to 0V) during the on-state of the bidirectional switch and voltage blocking capability when the bidirectional switch is in the off-state. The passive discharge circuit is passive in that no additional gate drivers, auxiliary supplies or control components are required to ensure proper operation, thus providing a fundamentally passive solution for holding the semiconductor substrate of the bidirectional switch at a desired voltage during the on-state of the bidirectional switch.

The passive discharge circuit behaves like an ideal active substrate control circuit during ZVS (zero voltage switching) operation and has near identical losses in both ZVS and hard switching as compared to active substrate control. Embodiments described herein use a combination of a normally-on device and a cross-coupled normally-off device symmetrically coupled to both sources and the substrate node and passively implements a logic function that chooses the correct source (at least two inputs) for defining the substrate potential.

While the passive discharge circuit described herein may be monolithically integrated with the main bidirectional switch, the passive discharge circuit instead may be external to (i.e., not integrated with) the main bidirectional switch. In this case, the electrical connections described herein between the passive discharge circuit and the main bidirectional switch may be formed through respective terminals of separate dies and/or packages which include the passive discharge circuit and the main bidirectional switch. Die-to-die, die-to-package, and package-to-package terminal connections are well known in the semiconductor device arts and can be implemented, e.g., by wire bonds, metal clips, metal ribbons, solder bumps, die stacking, package stacking, etc., and hence no further explanation is given herein to such terminal connections.

Described next with reference to the figures are embodiments of the passive discharge circuit.

Figure 1:
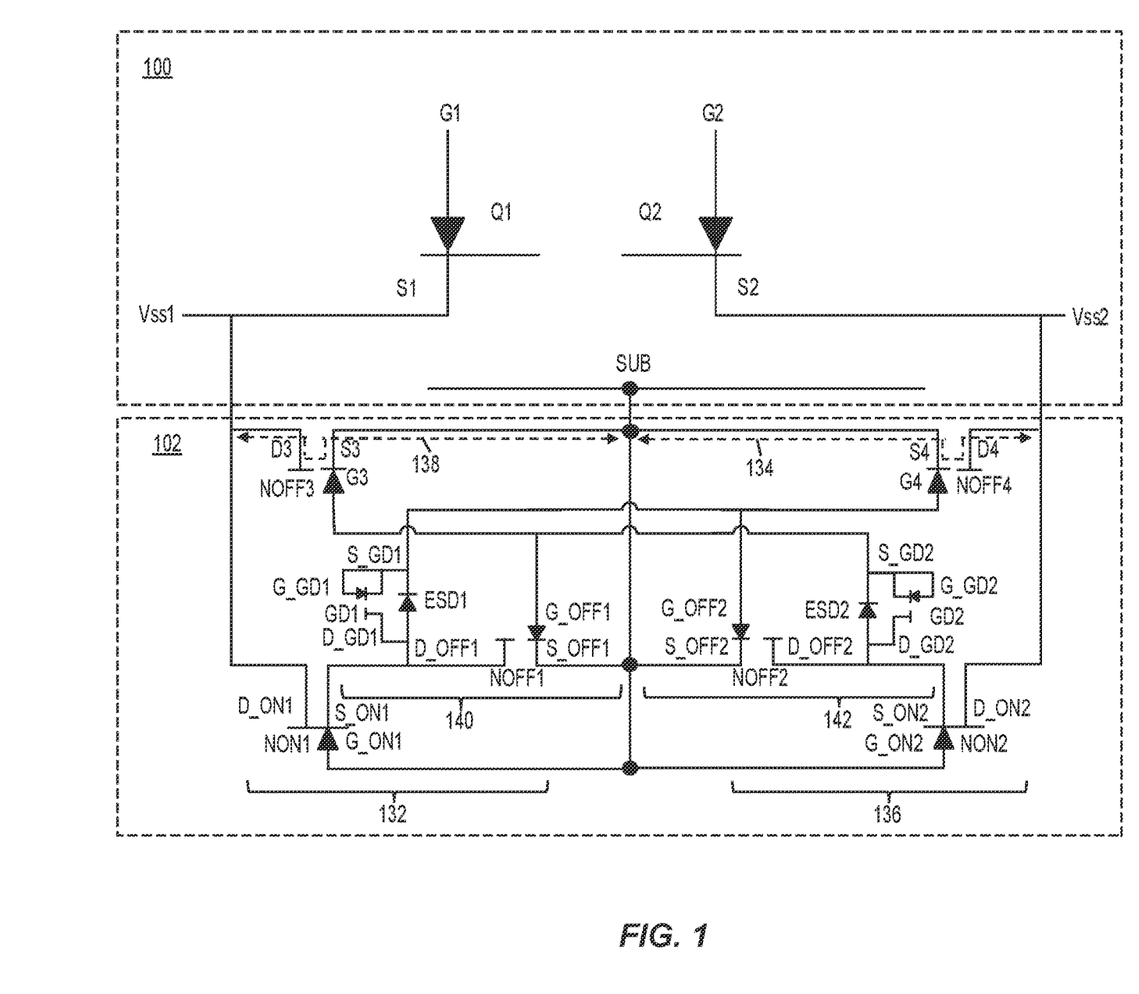
FIG. 1 illustrates a circuit schematic of an embodiment of a semiconductor device that includes a main bidirectional switch and a passive discharge circuit that provides a substrate discharge path during the on-state of the main bidirectional switch and voltage blocking when the main bidirectional switch is in the off-state.

FIG. 1 illustrates a circuit schematic of an embodiment of a semiconductor device that includes a main bidirectional switch 100 and a passive discharge circuit 102 that provides a substrate discharge path during the on-state of the main bidirectional switch 100 and voltage blocking when the main bidirectional switch 100 is in the off-state. The main bidirectional switch 100 is formed on a semiconductor substrate which is schematically represented by the node labeled 'SUB' in FIG. 1. The main bidirectional switch 100 has first and second gates G1, G2, first and second sources S1, S2, and a common drain. The first source S1 of the main bidirectional switch 100 is electrically connected to a first input-output terminal Vss1 and the second source S2 of the main bidirectional switch 100 is electrically connected to a second input-output terminal Vss2.

The main bidirectional switch 100 has four primary operational states: OFF/OFF in which both gates G1, G2 of the main bidirectional switch 100 are off; ON/ON in which both gates G1, G2 of the main bidirectional switch 100 are on; ON/OFF in which the first gate G1 of the main bidirectional switch 100 is on and the second gate G2 of the main bidirectional switch 100 is off; and OFF/ON in which the first gate G1 of the main bidirectional switch 100 is off and the second gate G2 of the main bidirectional switch 100 is on. The typical operation of a bidirectional switch includes transitioning from ON/OFF to ON/ON, and from OFF/ON to ON/ON. The current flow direction depends on the polarity across the first and second input-output terminals Vss1, Vss2 and can be reversed by changing the polarity.

Figure 2:
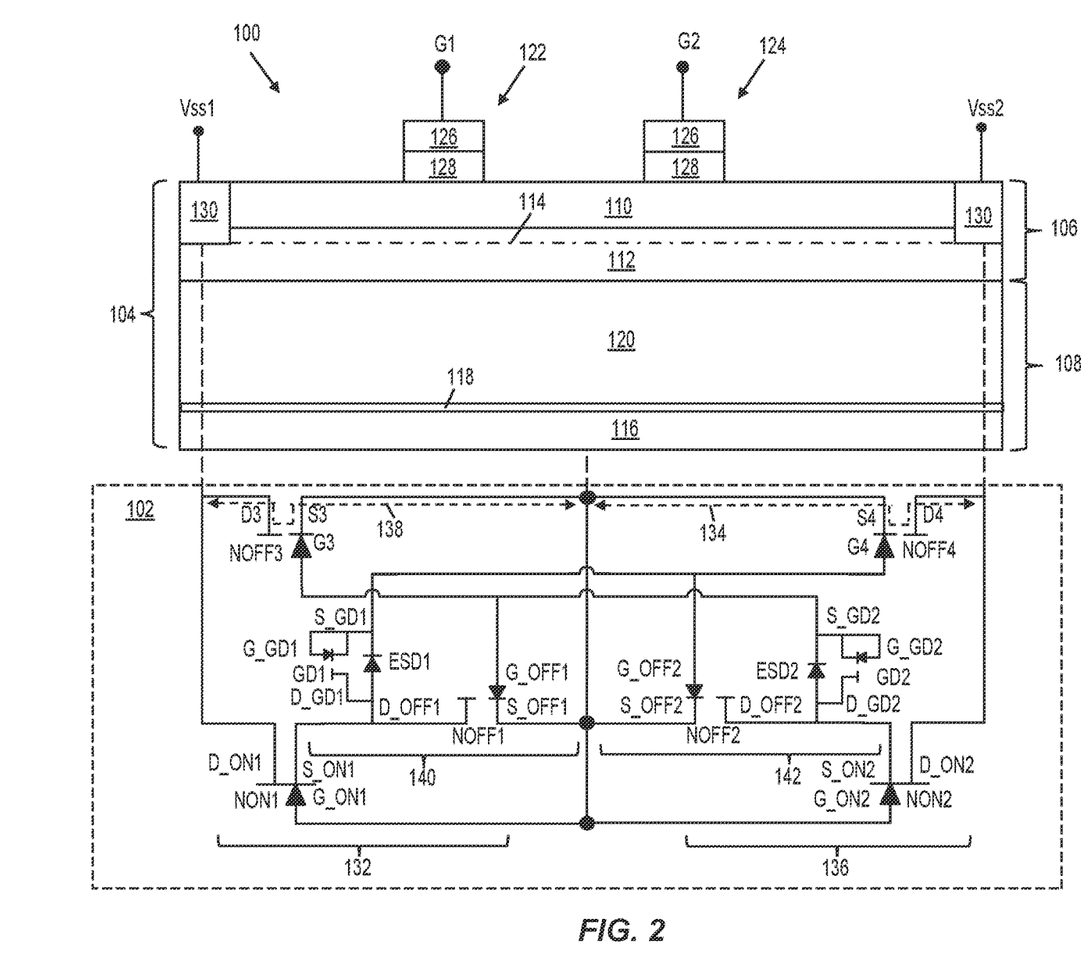
FIG. 2 illustrates a cross-sectional view of an embodiment of the physical implementation of the bidirectional switch in a semiconductor body.

The main bidirectional switch 100 is schematically represented by main transistors Q1 and Q2 in FIG. 1. Main transistors Q1 and Q2 share a common drain and have sources S1, S2 at opposite ends of the main bidirectional switch 100 in the case of a lateral device. FIG. 2 illustrates a cross-sectional view of an embodiment of the physical implementation of the bidirectional switch 100 in a semiconductor body 104. The bidirectional switch 100 is implemented as a bidirectional HEMT (high-electron mobility transistor) in FIG. 2.

The semiconductor body 104 has an upper active region 106 and a lower region 108 that is disposed beneath the active region 106. The active region 106 refers to the layers or regions of the semiconductor body 104 that provide an electrically conductive channel. For example, in the depicted embodiment, the active region 106 includes first and second type III-V semiconductor layers 110, 112. The second type III-V semiconductor layer 112 is formed from a semiconductor material having a different band gap than the first type III-V semiconductor layer 110. For example, the first type III-V semiconductor layer 110 may include intrinsic or lightly doped gallium nitride (GaN) and the second type III-V semiconductor layer 112 may include aluminum gallium nitride (AlGaN). More generally, any combination of type III-V semiconductor materials with different metallic contents can be used to provide a difference in bandgap.

Due to the difference in bandgap between the first and second type III-V semiconductor layers 110, 112, an electrically conductive two-dimensional charge carrier gas channel 114 arises near an interface between the first type III-V semiconductor layer 110 and the second type III-V semiconductor layer 112 due to polarization effects. Alternatively, instead of type III-V semiconductor material, the active region 106 may include group IV semiconductor materials such as Silicon (Si), Silicon carbide (SiC), Silicon germanium (SiGe), etc. The semiconductor materials may be doped to form active device regions, e.g., source, drain, collector, emitter, etc., which provide a controllable electrically conductive channel in a known manner.

The lower portion 108 of the semiconductor body 104 includes various regions of the semiconductor body 104 that do not directly contribute in an electrical sense to the provision of the electrically conductive channel 114. In the depicted embodiment, the lower portion 108 of the semiconductor body 104 includes a substrate region 116, a nucleation layer 118, and a lattice transition region 120. The substrate region 116 may include or be formed from group IV or group III-V semiconductor materials. For example, according to one embodiment, the substrate region 116 may be provided by a silicon or silicon-based wafer. The nucleation layer 118, which may include a metal nitride (e.g., AlN), and the lattice transition region 120, which may include a number of semiconductor nitride (e.g., AlGaN) layers with a gradually diminishing metallic content, are provided on the substrate region 116 to enable the formation of relatively strain and defect free group IV semiconductor material thereon. More generally, the substrate region 116 may include any intrinsic or bulk portion of the substrate that is beneath the active region 106, and is more conductive than an intermediary region that is between the substrate region 116 and the active region 106.

The main bidirectional switch 100 operates as follows. At a first voltage polarity, in which the second input-output terminal Vss2 is at a higher potential than the first input-output terminal Vss1, voltage blocking is primarily handled by a first gate structure 122. That is, an "OFF" signal applied to the first gate structure 122 (e.g., 0V, relative to the first input-output terminal Vss1) disrupts the channel 114 and causes the device to be in a blocking mode. The main bidirectional switch 100 becomes conductive by applying an "ON" signal (e.g., a positive voltage, relative to the first input-output terminal Vss1) to the first gate structure 122, which places the channel 114 in a conductive state. At a second voltage polarity, in which the first input-output terminal Vss1 is at a higher potential than the second input-output terminal Vss2, the opposite condition applies. That is, voltage blocking is primarily handled by a second gate structure 124.

In this way, the main bidirectional switch 100 can block or permit a current to flow in either direction between the first and second input-output terminals Vss1, Vss2. The main bidirectional switch 100 may have symmetrical voltage blocking capability at either voltage polarity. Alternatively, the main bidirectional switch 100 may be configured to have a greater voltage blocking capability at one of the two voltage polarities. This may be achieved by, among other things, adjusting the distance between the first and second gate structures 122, 124 and the first and second input-output terminals Vss1, Vss2.

The first and second gate structures 122, 124 may each include an electrically conductive gate electrode 126. According to one embodiment, the first and second gate structures 122, 124 may each also include an intermediary region 128 configured (e.g., by doping) to provide an integrated diode in the respective gate structures 122, 124. In the case of a type III-V semiconductor device, the first and second gate structures 122, 124 may be configured to alter the intrinsically conductive state of the two-dimensional charge carrier gas channel 114 in the active region 106 of the semiconductor body 104.

The main bidirectional power switch 100 may be symmetrical or asymmetrical. In the symmetrical case, both gates G1, G2 of the main bidirectional power switch 100 are normally-on or normally-off gates. In the asymmetrical case, one gate G1/G2 of the main bidirectional power switch 100 is normally-on (i.e., depletion mode) and the other gate G2/G1 of the main bidirectional power switch 100 is normally-off (i.e., enhancement mode). For a normally-on gate, a current conduction channel is present adjacent the gate absent any voltage being applied to the gate. For a normally-off gate, a current conduction channel is not present adjacent the gate without a suitable voltage applied to the gate.

Accordingly, the first gate G1 and the second gate G2 of the main bidirectional power switch 100 may each be a normally-off gate. In another embodiment, the first gate G1 and the second gate G2 of the main bidirectional power switch 100 are each a normally-on gate. In yet another embodiment, one of the first gate G1 and the second gate G2 of the main bidirectional power switch 100 is a normally-off gate and the other one of the first gate G1 and the second gate G2 of the main bidirectional power switch 100 is a normally-on gate.

Figure 3:
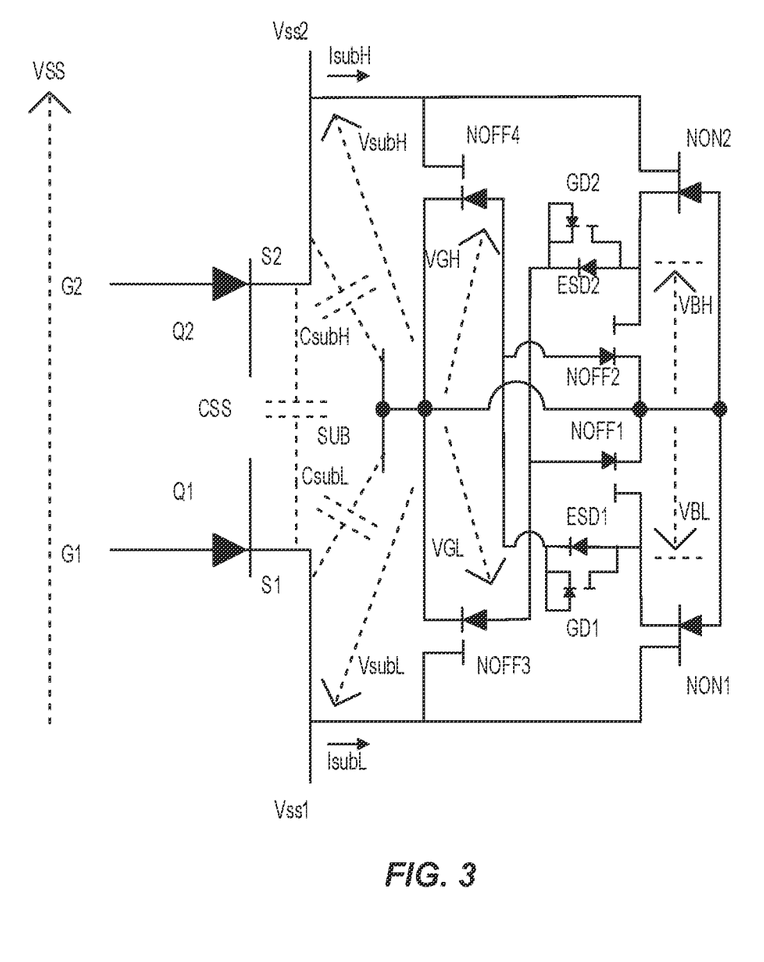
FIG. 3 illustrates various parasitic capacitances and voltages in the semiconductor device.

The main bidirectional switch 100 is integrated into a single substrate 104, as is the case in the device of FIG. 2, and is susceptible to the so-called 'common substrate' problem. In the absence of any further measures, there is a parasitic capacitive coupling that occurs between the first and second input-output terminals Vss1, Vss2 and the substrate region 116. The parasitic capacitances are shown in FIG. 3, where 'CsubL' is the parasitic capacitance between the first source S1 of the main bidirectional switch 100 and the substrate region 116 and 'CsubH' is the parasitic capacitance between the second source S2 of the main bidirectional switch 100 and the substrate region 116.

If the substrate region 116 is not adequately discharged during switching of the main bidirectional switch 100, the corresponding voltages 'VsubL', 'VsubH' across these parasitic capacitances CsubL, CsubH and referenced to the substrate region 116 can vary during the operation of the device, which may degrade the channel 114 and affect the switching behavior during operation of the main bidirectional switch 100. In a conventional unipolar device, this problem is typically solved by tying the substrate of the device to the same potential as the reference potential terminal (e.g., the source terminal) and thus shunting the parasitic substrate capacitance. However, this solution is not available in a bidirectional device because there is no dedicated reference potential terminal. That is, the first input-output terminal Vss1 acts as a reference potential at one voltage polarity whereas the second input-output terminal Vss2 acts as a reference potential at the opposite voltage polarity.

The passive discharge circuit 102 is bi-directional, symmetrical, and electrically connected in parallel with the main bidirectional switch 100, e.g., at respective source contact regions 130 of the main bidirectional switch 100. The passive discharge circuit 102 provides substrate discharging and voltage blocking capability in both directions of the main bidirectional switch 100. The passive discharge circuit 102 utilizes a fraction of the voltage VSS across the first and second input-output terminals Vss1, Vss2 to switch on a transistor device (e.g., NOFF3 or NOFF4 in FIG. 1) that electrically connects the substrate region 116 to the input-output terminal Vss1/Vss2 at the lower potential during an off-state of the main bidirectional switch 100 and during ZVS (zero-voltage switching) and hard switching transition periods.

In one embodiment, the passive discharge circuit 102 includes a first passive cascode circuit 132 that blocks the voltage VsubL between the first input-output terminal Vss1 and the substrate region 116 of the main bidirectional switch 100 and activates a first discharge path 134 between the substrate region 116 and the second input-output terminal Vss2, when the main bidirectional switch 100 is in the off-state and the first input-output terminal Vss1 is at a higher potential than the second input-output terminal Vss2. The passive discharge circuit 102 also includes a second passive cascode circuit 136 that blocks the voltage VsubH between the second input-output terminal Vss2 and the substrate region 116 of the main bidirectional switch 100 and activates a second discharge path 138 between the substrate region 116 and the first input-output terminal Vss1, when the main bidirectional switch 100 is in the off-state and the second input-output terminal Vss2 is at a higher potential than the first input-output terminal Vss1.

In FIGS. 1 and 2, the discharge path 138 between the substrate region 116 of the main bidirectional switch 100 and the first input-output terminal Vss1 includes a first normally-off transistor NOFF3 having a source S3 electrically connected to the substrate region 116, a drain D3 electrically connected to the first input-output terminal Vss1, and a gate G3 electrically connected to the second passive cascode circuit 136 and which does not require active control. Symmetrically, the discharge path 134 between the substrate region 116 and the second input-output terminal Vss2 includes a second normally-off transistor NOFF4 having a source S4 electrically connected to the substrate region 116, a drain D4 electrically connected to the second input-output terminal Vss2, and a gate G4 electrically connected to the first passive cascode circuit 132 and which does not require active control.

The transistors NOFF3, NOFF4 included in the respective discharge paths 138, 134 of the passive discharge circuit 102 are 'normally-off' transistors in that a current conduction channel is disrupted between the source S3, S4 and drain D3, D4 of the respective transistors NOFF3, NOFF4 absent any voltage being applied to the corresponding gate G3, G4. For example, the normally-off transistors NOFF3, NOFF4 included in the respective discharge paths 138, 134 of the passive discharge circuit 102 may be normally-off HEMTs. The normally-off transistors NOFF3, NOFF4 included in the respective discharge paths 138, 134 of the passive discharge circuit 102 may be integrally formed in the semiconductor body 104 shown in FIG. 2.

As shown in FIG. 3, the first passive cascode circuit 132 of the passive discharge circuit 102 provides a voltage 'VGH' referenced to the substrate region 116 for the gate G4 of the normally-off transistor NOFF4 included in the first discharge path 134, when the main bidirectional switch 100 is in the off-state and the first input-output terminal Vss1 is at a higher potential than the second input-output terminal Vss2. The first passive cascode circuit 132 may include a first step-down circuit 140 that reduces the voltage VGH applied to the gate G4 of the normally-off transistor NOFF4 included in the first discharge path 134.

Symmetrically, the second passive cascode circuit 136 of the passive discharge circuit 102 provides a voltage 'VGL' referenced to the substrate region 116 for the gate G3 of the normally-off transistor NOFF3 included in the second discharge path 138 when the main bidirectional switch 100 is in the off-state and the second input-output terminal Vss2 is at a higher potential than the first input-output terminal Vss1. The second passive cascode circuit 136 may include a second step-down circuit 142 that reduces the voltage VGL applied to the gate G3 of the normally-off transistor NOFF3 included in the second discharge path 138.

The first passive cascode circuit 132 of the passive discharge circuit 102 includes a first normally-on transistor NON1 having a source S_ON1 that controls the discharge path 134 between the substrate region 116 of the main bidirectional switch 100 and the second input-output terminal Vss2, a drain D_ON1 electrically connected to the first input-output terminal Vss1, and a gate G_ON1 electrically connected to the substrate region 116 and which does not require active control. The first passive cascode circuit 132 may also include a first normally-off transistor NOFF1 having a source S_OFF1 electrically connected to the substrate region 116, a drain D_OFF1 electrically connected to the source S_ON1 of the first normally-on transistor NON1, and a gate G_OFF1 electrically connected to the second passive cascode circuit 136 and which does not require active control.

Symmetrically, the second passive cascode circuit 136 of the passive discharge circuit 102 may include a second normally-on transistor NON2 having a source S_ON2 that controls the discharge path 138 between the substrate region 116 of the main bidirectional switch 100 and the first input-output terminal Vss1, a drain D_ON2 electrically connected to the second input-output terminal Vss2, and a gate G_ON2 electrically connected to the substrate region 116 and which does not require active control. The second passive cascode circuit 136 may also include a second normally-off transistor NOFF2 having a source S_OFF2 electrically connected to the substrate region 116, a drain D_OFF2 electrically connected to the source S_ON2 of the second normally-on transistor NON2, and a gate G_OFF2 electrically connected to the first passive cascode circuit 132 and which does not require active control.

The normally-on transistors NON1, NON2 of the passive cascode circuits 132, 136 are 'normally-on' transistors in that a current conduction channel is present between the source S_ON1, S_ON2 and drain D_ON1, D_ON2 of the respective transistor NON1, NON2 absent any voltage being applied to the corresponding gate G_ON1, G_ON2. For example, the normally-on transistors NON1, NON2 of the passive cascode circuits 132, 136 may be normally-on HEMTs. The normally-on transistors NON1, NON2 of the passive cascode circuits 132, 136 may be integrally formed in the semiconductor body 104 shown in FIG. 2.

In FIGS. 1 and 2, the gate G3 of the normally-off transistor NOFF3 included in the discharge path 138 between the substrate region 116 of the main bidirectional switch 100 and the first input-output terminal Vss1 is electrically connected to the source S_ON2 of the normally-on transistor NON2 of the second passive cascode circuit 136. Symmetrically, the gate G4 of the normally-off transistor NOFF4 included in the discharge path 134 between the substrate region 116 and the second input-output terminal Vss2 is electrically connected to the source S_ON1 of the normally-on transistor NON1 of the first passive cascode circuit 132.

In one embodiment, the normally-off transistor NOFF3 included in the second substrate discharge path 138 is at least 10 times larger than the normally-on transistor NON1 of the first passive cascode circuit 132 and the normally-off transistor NOFF4 included in the first substrate discharge path 134 is at least 10 times larger than the normally-on transistor NON2 of the second passive cascode circuit 136. For example, the normally-on transistors NON1, NON2 of the passive cascode circuits 132, 136 may have a size of about 100 µm (microns) whereas the normally-off transistors NOFF3, NOFF4 included in the substrate discharge paths 138, 134 may have a size of about 8 to 16 mm.

As explained above and shown in FIG. 3, the first passive cascode circuit 132 of the passive discharge circuit 102 provides a voltage VGH referenced to the substrate region 116 for the gate G4 of the normally-off transistor NOFF4 included in the discharge path 134 between the substrate region 116 and the second input-output terminal Vss2, when the main bidirectional switch 100 is in the off-state and the first input-output terminal Vss1 is at a higher potential than the second input-output terminal Vss2, and includes a first step-down circuit 140 that reduces the voltage VGH applied to the gate G4 of the normally-off transistor NOFF. The second passive cascode circuit 136 likewise provides a voltage VGL referenced to the substrate region 116 for the gate G3 of the normally-off transistor NOFF3 included in the discharge path 138 between the substrate region 116 and the first input-output terminal Vss1, when the main bidirectional switch 100 is in the off-state and the second input-output terminal Vss2 is at a higher potential than the first input-output terminal Vss1, and includes a second step-down circuit 142 that reduces the voltage VGL applied to the gate G3 of the normally-off transistor NOFF3.

In one embodiment, the first step-down circuit 140 includes a first ESD (electrostatic discharge) diode ESD1 having an anode electrically connected to the source S_ON1 of the normally-on transistor NON1 of the first passive cascode circuit 132 and a cathode electrically connected to the gate G4 of the normally-off transistor NOFF4 included in the discharge path 134 between the substrate region 116 and the second input-output terminal Vss2. Symmetrically, the second step-down circuit 142 includes a second ESD diode ESD2 having an anode electrically connected to the source S_ON2 of the normally-on transistor NON2 of the second passive cascode circuit 136 and a cathode electrically connected to the gate G3 of the normally-off transistor NOFF3 included in the discharge path 138 between the substrate region 116 and the first input-output terminal Vss1.

The first step-down circuit 140 of the first passive cascode circuit 132 may also include a first gated diode device GD1 coupled antiparallel with the first ESD diode ESD1. For example, the first gated diode device GD1 may be a HEMT having a gate G_GD1 and source S_GD1 electrically connected together to the cathode of the first ESD diode ESD1 and a drain D_GD1 electrically connected to the source S_ON1 of the normally-on transistor NON1 of the first passive cascode circuit 132. Likewise, the second step-down circuit 142 of the second passive cascode circuit 136 may include a second gated diode device GD2 coupled antiparallel with the second ESD diode ESD2. For example, the second gated diode device GD2 may be a HEMT having a gate G_GD2 and source S_GD2 electrically connected together to the cathode of the second ESD diode ESD2 and a drain D_GD2 electrically connected to the source S_ON2 of the normally-on transistor NON2 of the second passive cascode circuit 136.

In FIG. 3, the capacitance 'CSS' is similar to the output capacitance 'COSS' for a discrete unipolar device that blocks voltage in only one direction but permits current flow in both directions. However, for a unipolar device, the substrate is normally tied to source potential and the output capacitance COSS of the unipolar device corresponds to CSS+CsubH in FIG. 3 with CsubL shorted. Such a static/fixed configuration is not possible for the bidirectional switch 100 and therefore all three capacitances CSS, CsubL, and CsubH of the bidirectional device 100 are considered separate as shown in FIG. 3. The passive discharge circuit 102 passively emulates the behavior of the ideal active control which would dynamically activate the normally-off transistor NOFF3, NOFF4 in the correct discharge path 134, 138 to force the substrate region 116 to behave as if the bidirectional switch 100 were instead a discrete unipolar switch. The passive discharge circuit 102 provides adequate substrate discharging in both directions of operation and also enables lossless or near lossless ZVS behavior which is needed to switch at high frequencies, e.g., 2 MHz and above, but without requiring active control.

Figure 4:
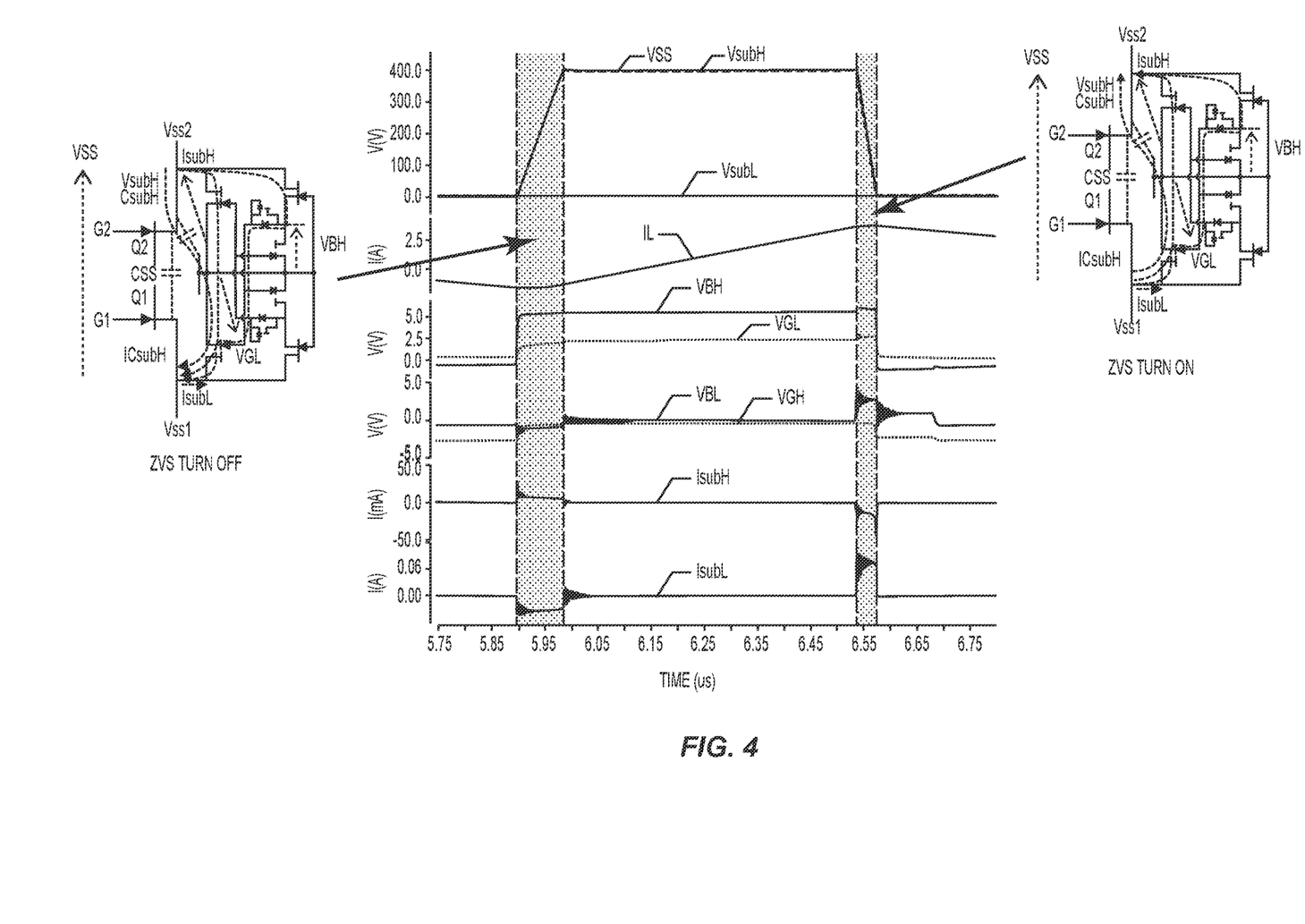

FIG. 4 illustrates a ZVS embodiment of the substrate discharging and voltage blocking capability provided by the passive discharge circuit 102. The middle part of FIG. 4 illustrates various voltage and current waveforms during ZVS turn on and ZVS turn off. The left-hand part of FIG. 4 illustrates the voltages and currents during ZVS turn off and the right-hand part of FIG. 4 illustrates the voltages and currents during ZVS turn on. ZVS eliminates the hard switching condition during turn on and reduces the voltage VSS across the first and second input-output terminals Vss1, Vss2 to zero or nearly zero, producing little or no high current spikes or damaging ringing. ZVS may use pulse width modulation (PWM)-based operation, but with an additional separate phase to the PWM timing to allow for ZVS operation.

During ZVS of the main bidirectional switch 100, a potential difference VsubH between the second input-output terminal Vss2 and the substrate region 116 remains at or near zero volt during turn on of the bidirectional switch 100 following an off-state of the bidirectional switch 100 in which the first input-output terminal Vss1 is at a higher potential than the second input-output terminal Vss2. Likewise, a potential difference VsubL between the first input-output terminal Vss1 and the substrate region 116 remains at or near zero volt during turn on of the bidirectional switch 100 following an off-state of the bidirectional switch 100 in which the second input-output terminal Vss2 is at a higher potential than the first input-output terminal Vss1.

During ZVS turn off (left-hand part of FIG. 4), the voltage VSS across the first and second input-output terminals Vss1, Vss2 rises according to the dv/dt of the ZVS turn on device Q2. In parallel, the voltage VsubH rises with VSS in reference to the substrate region 116 and is applied as cascode midpoint voltage VBH to the gate G_ON2 of the normally-on transistor NON2 of the second passive cascode circuit 136. Once cascode midpoint voltage VBH reaches the threshold voltage (e.g., about −4.5V) of the normally-on transistor NON2 of the second passive cascode circuit 136, the normally-on transistor NON2 turns off and the remaining voltage from VSS is blocked by the normally-on transistor NON2.

Cascode midpoint voltage VBH, referenced to the substrate region 116, is also applied as voltage VGL to the gate G3 of the normally-off transistor NOFF3 included in the discharge path 138 between the substrate region 116 and the first input-output terminal Vss1. The voltage VGL may be stepped down due to the voltage dropped across diode ESD2 of the second step-down circuit 142. Voltage VGL also turns on the normally-off transistor NOFF1 of the first passive cascode circuit 132 during the ZVS turn off transition. During this period, current IsubH (e.g., about 5 mA) is comparatively low compared to current IsubL (e.g., 330 mA), which indicates that the main device current does not flow through the discharge path 134 between the substrate region 116 and the second input-output terminal Vss2 but instead charges the large parasitic capacitor CsubH and then flows through the substrate region 116 via the normally-off transistor NOFF1 of the first passive cascode circuit 132. Since the normally-off transistor NOFF1 of the first passive cascode circuit 132 is on during this period, the loss is minimized. Otherwise, the current would conduct via the normally-off transistor NOFF1 of the first passive cascode circuit 132 as a diode which will increase the overall losses.

In a symmetric manner and for the opposite polarity of VSS, the normally-on transistor NON1 of the first passive cascode circuit 132 turns off when the cascode midpoint voltage VBL referenced to the substrate region 116 and applied to the gate G_ON1 of the normally-on transistor NON1 reaches the threshold voltage (e.g., about −4.5V) of the normally-on transistor NON1. The remaining voltage from VSS is blocked by the normally-on transistor NON1 in the off-state. The cascode midpoint voltage VBL of the first passive cascode circuit 132, referenced to the substrate region 116, is also applied as a voltage VGH to the gate G4 of the normally-off transistor NOFF4 included in the discharge path 134 between the substrate region 116 and the second input-output terminal Vss2. The voltage VGH may be stepped down due to the voltage dropped across diode ESD1 of the first step-down circuit 140. Voltage VGH also turns on the normally-off transistor NOFF2 of the second passive cascode circuit 136 during the ZVS turn off transition.

During ZVS turn on (right-hand part of FIG. 4), voltages VSS and VsubH are discharged in parallel via the inductive current 'IL' driven by an external inductor (not shown) coupled to the main bidirectional switch 100. Voltage VGL is kept on throughout this period, enabling lossless or near lossless ZVS turn on operation. This can be seen in FIG. 4 by the large discharge current IsubL which is dominated by the discharging of parasitic capacitance CsubH. After the ZVS turn on transition, the main bidirectional switch 100 is turned on and a conductive channel is formed and which electrically connects the first and second input-output terminals Vss1, Vss2. However, since the voltage VSS has collapsed at this state, the normally-off transistor NOFF2 of the second passive cascode circuit 136 is turned off. The internal voltages of the passive discharge circuit 102 are very close to zero and the cascode midpoint voltage VBH is approximately equal to voltage VSS in the conductive state plus cascode midpoint voltage VBL which is referenced to the substrate region 116. The passive discharge circuit 102 functions in a symmetric manner for the opposite polarity of VSS.

Figure 5:
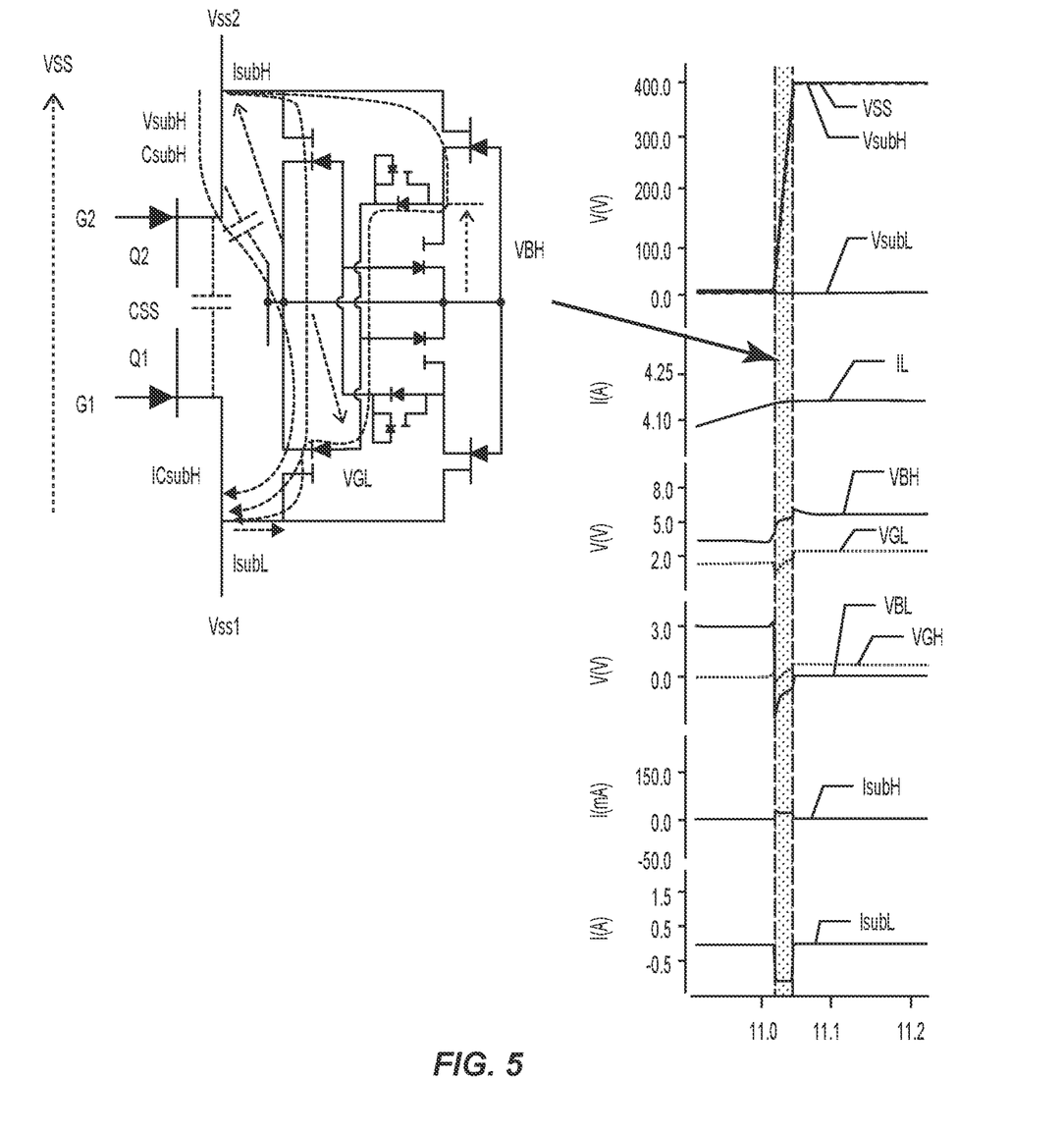

FIG. 5 illustrates a hard switching embodiment of the substrate discharging and voltage blocking capability provided by the passive discharge circuit 102. The middle part of FIG. 5 illustrates various voltage and current waveforms during hard switching turn on and turn off. The left-hand part of FIG. 5 illustrates the voltages and currents during hard switching turn off and the right-hand part of FIG. 5 illustrates the voltages and currents during three successive stages of hard switching turn on. High switching losses occur during hard switching due to the simultaneous occurrence of high-current and -voltage stress imposed on the bidirectional switch 100 during turn-on and turn-off transitions. These losses increase with switching frequency and input voltage and limit maximum frequency operation, efficiency, and power density.

During hard switching turn off (left-hand part of FIG. 5), the voltage VSS across the first and second input-output terminals Vss1, Vss2 rises in parallel with the voltage VsubH across parasitic capacitance CsubH since the normally-off transistor NOFF1 of the first passive cascode circuit 132 is turned on. The operation is much faster compared to ZVS turn off, but the overall behavior is similar.

For the first stage of hard switching turn on (upper right-hand part of FIG. 5), the voltage VSS across the first and second input-output terminals Vss1, Vss2 discharges to zero. By the end of the first stage, the main bidirectional device 100 is already fully on. The charges stored in parasitic capacitance CsubH which is referenced to the substrate region 116 discharges through the newly formed channel into parasitic capacitance CsubL and the two voltages VsubH, VsubL become equal at the end of the first stage. At the same time, the normally-off transistors NOFF1, NOFF2 of the passive cascode circuits 132, 136 are weakly on and help discharge the voltages VsubH, VsubL.

For the second stage of hard switching turn on (middle right-hand part of FIG. 5), VsubH=VsubL and the voltage VSS across the first and second input-output terminals Vss1, Vss2 is the conduction voltage of the main bidirectional switch 100. The normally-off transistors NOFF1, NOFF2 of the passive cascode circuits 132, 136 are both on and help to discharge the stored charge until the voltage VGH referenced to the substrate region 116 drops below the threshold voltage of the normally-off transistor NOFF2 of the second passive cascode circuit 136.

For the third stage of hard switching turn on (lower right-hand part of FIG. 5), the normally-off transistor NOFF2 of the second passive cascode circuit 136 is off but the normally-off transistor NOFF1 of the first passive cascode circuit 132 remains on to fully discharge the voltage VsubH which is effectively in parallel to voltage VsubL which can be seen by the current IsubL.

Figure 6:
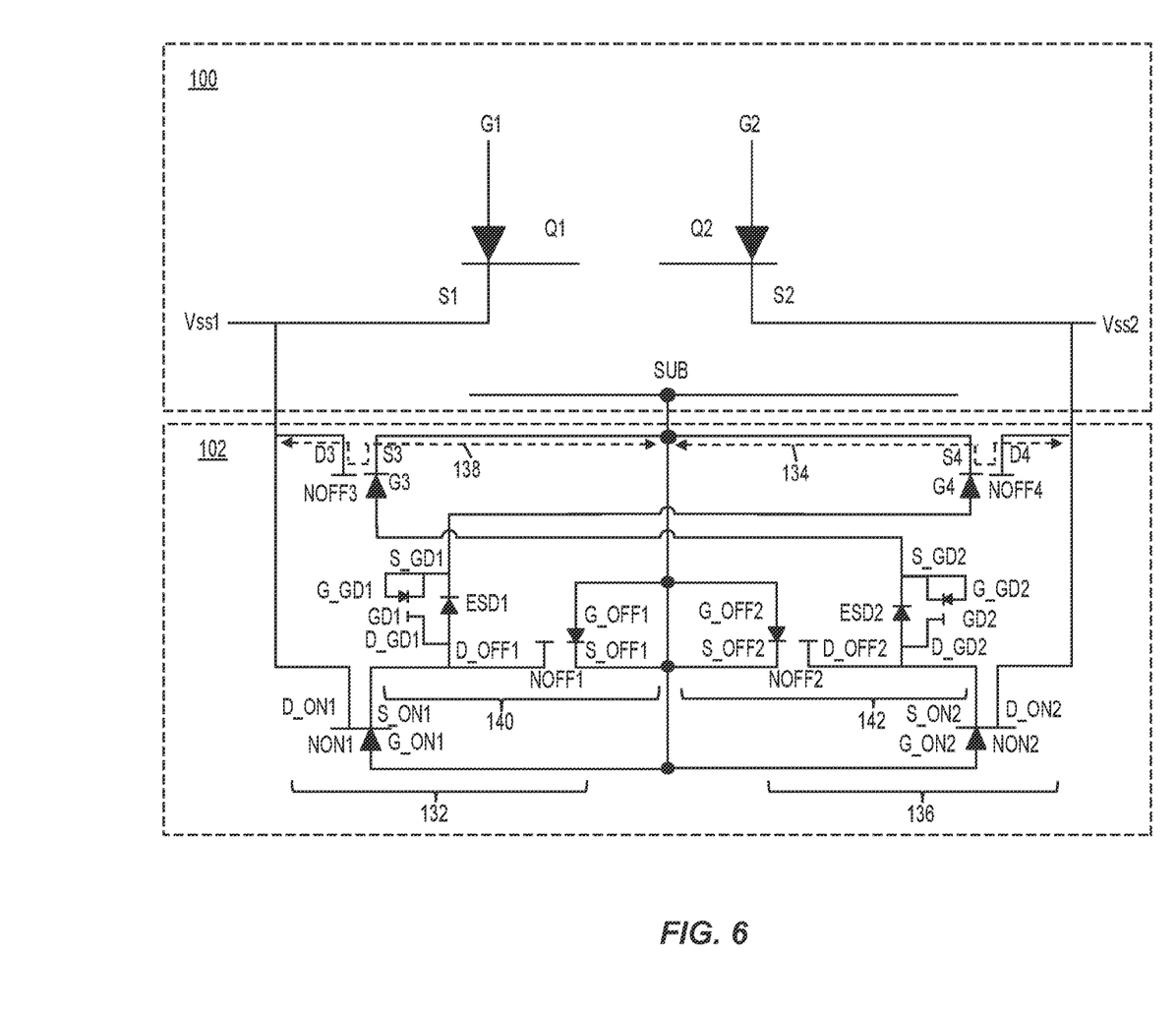
FIG. 6 illustrates a circuit schematic of another embodiment of a semiconductor device that includes the main bidirectional switch and the passive discharge circuit.

FIG. 6 illustrates a circuit schematic of another embodiment of a semiconductor device that includes the main bidirectional switch 100 and the passive discharge circuit 102. The embodiment illustrated in FIG. 6 is similar to the embodiment illustrated in FIGS. 1 and 2. In FIG. 6, both the gate G_OFF1 of the normally-off transistor NOFF1 of the first passive cascode circuit 132 and the gate G_OFF2 of the normally-off transistor NOFF2 of the second passive cascode circuit 136 are electrically connected to the substrate region 116 of the main bidirectional switch 100. According to this embodiment, the passive cascode circuits 132, 136 do not aid in discharging the substrate region 116 during ZVS and hard switching operations. However, the passive cascode circuits 132, 136 are relatively small compared to the normally-off transistors NOFF3, NOFF4 included in the discharge paths 138, 134 and therefore the losses for the embodiment illustrated in FIG. 6 are essentially the same as the losses for the embodiment illustrated in FIGS. 1 and 2.

Figure 7:
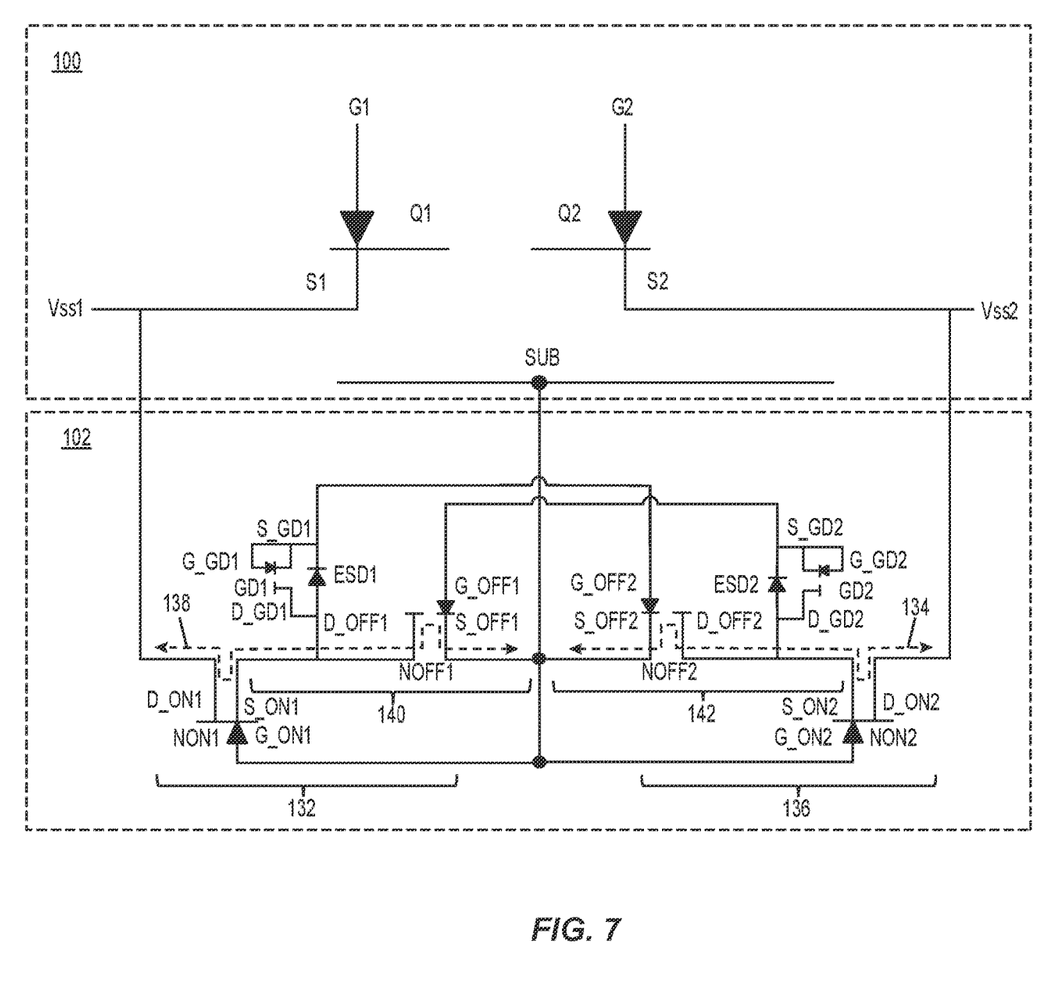
FIG. 7 illustrates a circuit schematic of another embodiment of a semiconductor device that includes the main bidirectional switch and the passive discharge circuit.

FIG. 7 illustrates a circuit schematic of another embodiment of a semiconductor device that includes the main bidirectional switch 100 and the passive discharge circuit 102. The embodiment illustrated in FIG. 7 is similar to the embodiment illustrated in FIGS. 1 and 2. In FIG. 7, the normally-off transistors NOFF3, NOFF4 are omitted from the passive discharge circuit 102. According to this embodiment, the normally-on transistor NON1 and the normally-off transistor NOFF1 of the first passive cascode circuit 132 form the discharge path 138 between the substrate region 116 of the main bidirectional switch 100 and the first input-output terminal Vss1. Symmetrically, the normally-on transistor NON2 and the normally-off transistor NOFF2 of the second passive cascode circuit 136 form the discharge path 134 between the substrate region 116 and the second input-output terminal Vss2.

In FIG. 7, the cathode of the ESD diode ESD1 of the first step-down circuit 140 is electrically connected to the gate G_OFF2 of the normally-off transistor NOFF2 of the second step-down circuit 142. The cathode of the ESD diode ESD2 of the second step-down circuit 142 is likewise electrically connected to the gate G_OFF1 of the normally-off transistor NOFF1 of the first step-down circuit 140.

In FIG. 7, the normally-on transistors NON1, NON2 and the normally-off transistors NOFF1, NOF22 of the passive cascode circuits 132, 136 form the respective substrate discharge paths 138, 134 and therefore the sizes of these devices NON1, NON2, NOFF1, NOFF2 are significantly larger than compared to the embodiments illustrated in FIGS. 1, 2 and 6. When the cascode midpoint voltage VBH referenced to the substrate region 116 and applied to the gate G_ON2 of the normally-on transistor NON2 of the second passive cascode circuit 136 reaches the threshold voltage (e.g., about −4.5V) of the normally-on transistor NON2, the normally-on transistor NON2 turns off and the remaining voltage from VSS is blocked by the normally-on transistor NON2. The cascode midpoint voltage VBH of the second passive cascode circuit 136, referenced to the substrate region 116, is also applied as a voltage to the gate G_OFF1 of the normally-off transistor NOFF1 of the first passive cascode circuit 132 to activate the discharge path 138 between the substrate region 116 of the main bidirectional switch 100 and the first input-output terminal Vss1 in FIG. 7. This voltage may be stepped down due to the voltage dropped across diode ESD2 of the second step-down circuit 142.

In a symmetric manner and for the opposite polarity of VSS, the normally-on transistor NON1 of the first passive cascode circuit 132 turns off when the cascode midpoint voltage VBL referenced to the substrate region 116 and applied to the gate G_ON1 of the normally-on transistor NON1 reaches the threshold voltage (e.g., about −4.5V) of the normally-on transistor NON1. The remaining voltage from VSS is blocked by the normally-on transistor NON1 in the off-state. The cascode midpoint voltage VBL of the first passive cascode circuit 132, referenced to the substrate region 116, is also applied as a voltage to the gate G_OFF2 of the normally-off transistor NOFF2 of the second passive cascode circuit 136 to activate the discharge path 134 between the substrate region 116 of the main bidirectional switch 100 and the second input-output terminal Vss2 in FIG. 7. This voltage may be stepped down due to the voltage dropped across diode ESD1 of the second step-down circuit 140.

Although the present disclosure is not so limited, the following numbered examples demonstrate one or more aspects of the disclosure.

Example 1. A semiconductor device, comprising: a semiconductor body comprising an active region and a substrate region beneath the active region; a bidirectional switch comprising first and second gate structures configured to control a conductive state of a channel in the active region, and first and second input-output terminals electrically connected to the channel; a first passive cascode circuit configured to block a voltage between the first input-output terminal and the substrate region and activate a discharge path between the substrate region and the second input-output terminal, when the bidirectional switch is in an off-state and the first input-output terminal is at a higher potential than the second input-output terminal; and a second passive cascode circuit configured to block a voltage between the second input-output terminal and the substrate region and activate a discharge path between the substrate region and the first input-output terminal, when the bidirectional switch is in the off-state and the second input-output terminal is at a higher potential than the first input-output terminal.

Example 2. The semiconductor device of example 1, wherein: the discharge path between the substrate region and the first input-output terminal comprises a first normally-off transistor having a source electrically connected to the substrate region, a drain electrically connected to the first input-output terminal, and a gate electrically connected to the second passive cascode circuit; and the discharge path between the substrate region and the second input-output terminal comprises a second normally-off transistor having a source electrically connected to the substrate region, a drain electrically connected to the second input-output terminal, and a gate electrically connected to the first passive cascode circuit.

Example 3. The semiconductor device of example 2, wherein: the first passive cascode circuit is configured to provide a voltage for the gate of the second normally-off transistor when the bidirectional switch is in the off-state and the first input-output terminal is at a higher potential than the second input-output terminal, and comprises a first step-down circuit configured to reduce the voltage applied to the gate of the second normally-off transistor; and the second passive cascode circuit is configured to provide a voltage for the gate of the first normally-off transistor when the bidirectional switch is in the off-state and the second input-output terminal is at a higher potential than the first input-output terminal, and comprises a second step-down circuit configured to reduce the voltage applied to the gate of the first normally-off transistor.

Example 4. The semiconductor device of any of examples 1 through 3, wherein: the first passive cascode circuit comprises a first normally-on transistor having a source that controls the discharge path between the substrate region and the second input-output terminal, a drain electrically connected to the first input-output terminal, and a gate electrically connected to the substrate region, and a first normally-off transistor having a source electrically connected to the substrate region, a drain electrically connected to the source of the first normally-on transistor, and a gate electrically connected to the second passive cascode circuit or the substrate region; and the second passive cascode circuit comprises a second normally-on transistor having a source that controls the discharge path between the substrate region and the first input-output terminal, a drain electrically connected to the second input-output terminal, and a gate electrically connected to the substrate region, and a second normally-off transistor having a source electrically connected to the substrate region, a drain electrically connected to the source of the second normally-on transistor, and a gate electrically connected to the first passive cascode circuit or the substrate region.

Example 5. The semiconductor device of example 4, wherein: the discharge path between the substrate region and the first input-output terminal comprises a third normally-off transistor having a source electrically connected to the substrate region, a drain electrically connected to the first input-output terminal, and a gate electrically connected to the source of the second normally-on transistor; and the discharge path between the substrate region and the second input-output terminal comprises a fourth normally-off transistor having a source electrically connected to the substrate region, a drain electrically connected to the second input-output terminal, and a gate electrically connected to the source of the first normally-on transistor.

Example 6. The semiconductor device of example 5, wherein: the first passive cascode circuit is configured to provide a voltage for the gate of the fourth normally-off transistor when the bidirectional switch is in the off-state and the first input-output terminal is at a higher potential than the second input-output terminal, and comprises a first step-down circuit configured to reduce the voltage applied to the gate of the fourth normally-off transistor; and the second passive cascode circuit is configured to provide a voltage for the gate of the third normally-off transistor when the bidirectional switch is in the off-state and the second input-output terminal is at a higher potential than the first input-output terminal, and comprises a second step-down circuit configured to reduce the voltage applied to the gate of the third normally-off transistor.

Example 7. The semiconductor device of example 6, wherein: the first step-down circuit comprises a first ESD (electrostatic discharge) diode having an anode electrically connected to the source of the first normally-on transistor and a cathode electrically connected to the gate of the fourth normally-off transistor; and the second step-down circuit comprises a second ESD diode having an anode electrically connected to the source of the second normally-on transistor and a cathode electrically connected to the gate of the third normally-off transistor.

Example 8. The semiconductor device of example 7, wherein: the first step-down circuit comprises a first gated diode device coupled antiparallel with the first ESD diode; and the second step-down circuit comprises a second gated diode device coupled antiparallel with the second ESD diode.

Example 9. The semiconductor device of any of examples 5 through 8, wherein: the third normally-off transistor is at least 10 times larger than the first normally-on transistor; and the fourth normally-off transistor is at least 10 times larger than the second normally-on transistor.

Example 10. The semiconductor device of any of examples 5 through 9, wherein: the gate of the first normally-off transistor is electrically connected to the cathode of the second ESD diode; and the gate of the second normally-off transistor is electrically connected to the cathode of the first ESD diode.

Example 11. The semiconductor device of any of examples 4 through 10, wherein: the gate of the first normally-off transistor is electrically connected to the substrate region; and the gate of the second normally-off transistor is electrically connected to the substrate region.

Example 12. The semiconductor device of any of examples 4 through 11, wherein: the first normally-on transistor and the first normally-off transistor of the first passive cascode circuit form the discharge path between the substrate region and the first input-output terminal; and the second normally-on transistor and the second normally-off transistor of the second passive cascode circuit form the discharge path between the substrate region and the second input-output terminal.

Example 13. The semiconductor device of example 12, wherein: the first step-down circuit comprises a first ESD (electrostatic discharge) diode having an anode electrically connected to the source of the first normally-on transistor and a cathode electrically connected to the gate of the second normally-off transistor; and the second step-down circuit comprises a second ESD diode having an anode electrically connected to the source of the second normally-on transistor and a cathode electrically connected to the gate of the first normally-off transistor.

Example 14. The semiconductor device of example 13, wherein: the first step-down circuit comprises a first gated diode device coupled antiparallel with the first ESD diode; and the second step-down circuit comprises a second gated diode device coupled antiparallel with the second ESD diode.

Example 15. The semiconductor device of any of examples 1 through 14, wherein during ZVS (zero-voltage switching) of the bidirectional switch: a potential difference between the second input-output terminal and the substrate region remains at or near zero volt during turn on of the bidirectional switch following an off-state of the bidirectional switch in which the first input-output terminal is at a higher potential than the second input-output terminal; and a potential difference between the first input-output terminal and the substrate region remains at or near zero volt during turn on of the bidirectional switch following an off-state of the bidirectional switch in which the second input-output terminal is at a higher potential than the first input-output terminal.

Example 16. The semiconductor device of any of examples 1 through 15, wherein: the first gate structure of the bidirectional switch is a normally-on gate structure; and the second gate structure of the bidirectional switch is a normally-on gate structure.

Example 17. The semiconductor device of any of examples 1 through 15, wherein: the first gate structure of the bidirectional switch is a normally-off gate structure; and the second gate structure of the bidirectional switch is a normally-off gate structure.

Example 18. The semiconductor device of any of examples 1 through 15, wherein: one of the first gate structure and the second gate structure of the bidirectional switch is a normally-on gate structure; and the other one of the first gate structure and the second gate structure of the bidirectional switch is a normally-off gate structure.

Example 19. A semiconductor device, comprising: a semiconductor body comprising an active region and a substrate region beneath the active region; a bidirectional switch comprising first and second gate structures configured to control a conductive state of a channel in the active region, and first and second input-output terminals electrically connected to the channel; and a passive discharge circuit in parallel with the bidirectional switch and configured to utilize a fraction of a voltage across the first and second input-output terminals to switch on a transistor device that electrically connects the substrate region to the input-output terminal at the lower potential during an off-state of the bidirectional switch and during ZVS (zero-voltage switching) transition periods.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body comprising an active region and a substrate region beneath the active region;
   a bidirectional switch comprising first and second gate structures configured to control a conductive state of a channel in the active region, and first and second input-output terminals electrically connected to the channel;
   a first passive cascode circuit configured to block a voltage between the first input-output terminal and the substrate region and activate a discharge path between the substrate region and the second input-output terminal, when the bidirectional switch is in an off-state and the first input-output terminal is at a higher potential than the second input-output terminal; and
   a second passive cascode circuit configured to block a voltage between the second input-output terminal and the substrate region and activate a discharge path between the substrate region and the first input-output terminal, when the bidirectional switch is in the off-state and the second input-output terminal is at a higher potential than the first input-output terminal.

2. The semiconductor device of claim 1, wherein:
   the discharge path between the substrate region and the first input-output terminal comprises a first normally-off transistor having a source electrically connected to the substrate region, a drain electrically connected to the first input-output terminal, and a gate electrically connected to the second passive cascode circuit; and the discharge path between the substrate region and the second input-output terminal comprises a second normally-off transistor having a source electrically connected to the substrate region, a drain electrically connected to the second input-output terminal, and a gate electrically connected to the first passive cascode circuit.

3. The semiconductor device of claim 2, wherein:
the first passive cascode circuit is configured to provide a voltage for the gate of the second normally-off transistor when the bidirectional switch is in the off-state and the first input-output terminal is at a higher potential than the second input-output terminal, and comprises a first step-down circuit configured to reduce the voltage applied to the gate of the second normally-off transistor; and
the second passive cascode circuit is configured to provide a voltage for the gate of the first normally-off transistor when the bidirectional switch is in the off-state and the second input-output terminal is at a higher potential than the first input-output terminal, and comprises a second step-down circuit configured to reduce the voltage applied to the gate of the first normally-off transistor.

4. The semiconductor device of claim 1, wherein:
the first passive cascode circuit comprises a first normally-on transistor having a source that controls the discharge path between the substrate region and the second input-output terminal, a drain electrically connected to the first input-output terminal, and a gate electrically connected to the substrate region, and a first normally-off transistor having a source electrically connected to the substrate region, a drain electrically connected to the source of the first normally-on transistor, and a gate electrically connected to the second passive cascode circuit or the substrate region; and
the second passive cascode circuit comprises a second normally-on transistor having a source that controls the discharge path between the substrate region and the first input-output terminal, a drain electrically connected to the second input-output terminal, and a gate electrically connected to the substrate region, and a second normally-off transistor having a source electrically connected to the substrate region, a drain electrically connected to the source of the second normally-on transistor, and a gate electrically connected to the first passive cascode circuit or the substrate region.

5. The semiconductor device of claim 4, wherein:
the discharge path between the substrate region and the first input-output terminal comprises a third normally-off transistor having a source electrically connected to the substrate region, a drain electrically connected to the first input-output terminal, and a gate electrically connected to the source of the second normally-on transistor; and
the discharge path between the substrate region and the second input-output terminal comprises a fourth normally-off transistor having a source electrically connected to the substrate region, a drain electrically connected to the second input-output terminal, and a gate electrically connected to the source of the first normally-on transistor.

6. The semiconductor device of claim 5, wherein:
the first passive cascode circuit is configured to provide a voltage for the gate of the fourth normally-off transistor when the bidirectional switch is in the off-state and the first input-output terminal is at a higher potential than the second input-output terminal, and comprises a first step-down circuit configured to reduce the voltage applied to the gate of the fourth normally-off transistor; and
the second passive cascode circuit is configured to provide a voltage for the gate of the third normally-off transistor when the bidirectional switch is in the off-state and the second input-output terminal is at a higher potential than the first input-output terminal, and comprises a second step-down circuit configured to reduce the voltage applied to the gate of the third normally-off transistor.

7. The semiconductor device of claim 6, wherein:
the first step-down circuit comprises a first ESD (electrostatic discharge) diode having an anode electrically connected to the source of the first normally-on transistor and a cathode electrically connected to the gate of the fourth normally-off transistor; and
the second step-down circuit comprises a second ESD diode having an anode electrically connected to the source of the second normally-on transistor and a cathode electrically connected to the gate of the third normally-off transistor.

8. The semiconductor device of claim 7, wherein:
the first step-down circuit comprises a first gated diode device coupled antiparallel with the first ESD diode; and
the second step-down circuit comprises a second gated diode device coupled antiparallel with the second ESD diode.

9. The semiconductor device of claim 5, wherein:
the third normally-off transistor is at least 10 times larger than the first normally-on transistor; and
the fourth normally-off transistor is at least 10 times larger than the second normally-on transistor.

10. The semiconductor device of claim 5, wherein:
the gate of the first normally-off transistor is electrically connected to a cathode of a second ESD diode; and
the gate of the second normally-off transistor is electrically connected to a cathode of a first ESD diode.

11. The semiconductor device of claim 4, wherein:
the gate of the first normally-off transistor is electrically connected to the substrate region; and
the gate of the second normally-off transistor is electrically connected to the substrate region.

12. The semiconductor device of claim 4, wherein:
the first normally-on transistor and the first normally-off transistor of the first passive cascode circuit form the discharge path between the substrate region and the first input-output terminal; and
the second normally-on transistor and the second normally-off transistor of the second passive cascode circuit form the discharge path between the substrate region and the second input-output terminal.

13. The semiconductor device of claim 12, wherein:
the first step-down circuit comprises a first ESD (electrostatic discharge) diode having an anode electrically connected to the source of the first normally-on transistor and a cathode electrically connected to the gate of the second normally-off transistor; and
the second step-down circuit comprises a second ESD diode having an anode electrically connected to the source of the second normally-on transistor and a cathode electrically connected to the gate of the first normally-off transistor.

14. The semiconductor device of claim 13, wherein:
the first step-down circuit comprises a first gated diode device coupled antiparallel with the first ESD diode; and
the second step-down circuit comprises a second gated diode device coupled antiparallel with the second ESD diode.

15. The semiconductor device of claim 1, wherein during ZVS (zero-voltage switching) of the bidirectional switch:
a potential difference between the second input-output terminal and the substrate region remains at or near zero volt during turn on of the bidirectional switch following an off-state of the bidirectional switch in which the first input-output terminal is at a higher potential than the second input-output terminal; and
a potential difference between the first input-output terminal and the substrate region remains at or near zero volt during turn on of the bidirectional switch following an off-state of the bidirectional switch in which the second input-output terminal is at a higher potential than the first input-output terminal.

16. The semiconductor device of claim 1, wherein:
the first gate structure of the bidirectional switch is a normally-on gate structure; and
the second gate structure of the bidirectional switch is a normally-on gate structure.

17. The semiconductor device of claim 1, wherein:
the first gate structure of the bidirectional switch is a normally-off gate structure; and
the second gate structure of the bidirectional switch is a normally-off gate structure.

18. The semiconductor device of claim 1, wherein:
one of the first gate structure and the second gate structure of the bidirectional switch is a normally-on gate structure; and
the other one of the first gate structure and the second gate structure of the bidirectional switch is a normally-off gate structure.

19. A semiconductor device, comprising:
a semiconductor body comprising an active region and a substrate region beneath the active region;
a bidirectional switch comprising first and second gate structures configured to control a conductive state of a channel in the active region, and first and second input-output terminals electrically connected to the channel; and
a passive discharge circuit in parallel with the bidirectional switch and configured to utilize a fraction of a voltage across the first and second input-output terminals to switch on a transistor device that electrically connects the substrate region to the input-output terminal at the lower potential during an off-state of the bidirectional switch and during ZVS (zero-voltage switching) transition periods.

\* \* \* \* \*